United States Patent
Cheon et al.

(10) Patent No.: US 6,923,923 B2
(45) Date of Patent: Aug. 2, 2005

(54) METALLIC NANOPARTICLE CLUSTER INK AND METHOD FOR FORMING METAL PATTERN USING THE SAME

(75) Inventors: Jin Woo Cheon, Daejun-Shi (KR); Sung Nam Cho, Chungcheongnam-Do (KR); Jong Il Park, Gyeongsangbuk-Do (KR); Kyung Bok Lee, Ulsan-Shi (KR); Seok Chang, Daejun-Shi (KR); Soon Taik Hwang, Sungnam-Shi (KR)

(73) Assignees: Samsung Electronics Co., Ltd., Kyungki-Do (KR); Korea Advanced Institute of Science and Technology, Daejun-Shi (KR)

( * ) Notice: Subject to any disclaimer, the term of this patent is extended or adjusted under 35 U.S.C. 154(b) by 28 days.

(21) Appl. No.: 10/329,682

(22) Filed: Dec. 27, 2002

(65) Prior Publication Data

US 2003/0168639 A1 Sep. 11, 2003

(30) Foreign Application Priority Data

Dec. 29, 2001 (KR) ......................................... 2001-87877
Dec. 24, 2002 (KR) ......................................... 2002-82989

(51) Int. Cl.$^7$ .............................. H05K 1/09; H01B 1/22; C09D 11/00
(52) U.S. Cl. ........................ 252/512; 252/500; 252/514; 252/519.3; 428/901; 428/317.3; 428/403; 427/212; 427/213.3; 430/33; 430/32; 106/31.13; 106/31.89
(58) Field of Search .......................... 250/500; 252/512, 252/514, 519.3, 500, 516, 579.5; 427/212, 213.3; 428/901, 317.3, 403, 704; 106/31.13, 31.35, 31.89

(56) References Cited

U.S. PATENT DOCUMENTS

| | | | |
|---|---|---|---|
| 3,873,306 A | | 3/1975 | Lando |
| 3,873,359 A | | 3/1975 | Lando |
| 3,900,614 A | | 8/1975 | Lando |
| 5,322,751 A | * | 6/1994 | Chou et al. .................... 430/33 |
| 5,512,131 A | * | 4/1996 | Kumar et al. ................ 438/738 |
| 5,922,403 A | * | 7/1999 | Tecle ........................... 427/212 |
| 6,020,047 A | * | 2/2000 | Everhart ...................... 428/209 |
| 6,048,623 A | * | 4/2000 | Everhart et al. ............. 428/464 |
| 2003/0116057 A1 | * | 6/2003 | Suzuki et al. ............. 106/31.33 |

FOREIGN PATENT DOCUMENTS

KR   1998-025037   7/1998

OTHER PUBLICATIONS

Hu et al, Nanostructure Science and Technology, A Worldwide Study, Kluwer Academic Publishers, 1999, Chapter–II, p.–1 33.*

Brust et al, "Novel Gold–Dithiol Nanonetworks with Non-metallic Electronic Properties", Adv. Mater., 1995, 7(9), 795.*

Osifchin et al, "Synthesis of nanoscale arrays of coupled metal dots", Nanotechnology, 1996, 7, 412–416.*

(Continued)

Primary Examiner—Mark Kopec
Assistant Examiner—Kallambella Vijayakumar
(74) Attorney, Agent, or Firm—Birch, Stewart, Kolasch & Birch, LLP

(57) ABSTRACT

Disclosed are a metallic nanoparticle cluster ink and a method for forming a conductive metal pattern using the cluster ink. The metallic nanoparticle cluster ink comprises colloidal metallic nanoparticles and a bifunctional compound. The conductive metal pattern is formed by forming a metallic nanoparticle pattern on a substrate using a mold made from PDMS (poly(dimethylsiloxane) polymer as a stamp, and heat-treating the substrate. Micrometer-sized conductive metal patterns can be easily formed on various substrates in a simple and inexpensive manner without the use of costly systems, thereby being very useful in various industrial fields.

2 Claims, 4 Drawing Sheets

OTHER PUBLICATIONS

Andreas et al, "Handbook of Nanostructural Materials and Nanotechnology", Ed. H.S. Nalwa, Academic Press, San Diego, 200 Chapter–4, pp. 179–231.*

Hutter et al, "Surface Plasmon Resonance Method for Probing Interactions in Nanostructures", J. Appl. Phys. 2001, 90)4), 197 1985.*

Xie et al,"Soft lithography", Angew. Chem. Int. Ed., 1998, 37, 550–575.*

Younan Xia and George M. Whitesides, "Soft Lithography;" Angew. Chem. Int. Ed. 1998 vol. 37, pp. 550–575.

W. Peter Wuelfing et al.; "Monolayer–Protected Clusters: Molecular Precursors to Metal Films" Chem Mater. 2001, vol. 13, pp. 87–95.

So Young Kang and Kwan Kim; "Comparative Study of Dodecanethiol–Derivatized Silver Nanoparticles Prepared in One–Phase and Two–Phase Systems" Langmuir 1998 vol. 14, 226–230.

* cited by examiner

METALLIC NANOPARTICLE CLUSTER INK AND METHOD FOR FORMING METAL PATTERN USING THE SAME

BACKGROUND OF THE INVENTION

This application claims the benefit of the Korean Application Nos. 2001-87877 filed on Dec. 29, 2001 and 2002-82989 filed on Dec. 24, 2002, which are hereby incorporated by references.

1. Field of the Invention

The present invention relates to a metallic nanoparticle cluster ink and a method for forming a conductive metal pattern using the cluster ink. More specifically, the present invention relates to a metallic nanoparticle cluster ink comprising colloidal metallic nanoparticles and a bifunctional compound, and a method for forming a conductive metal pattern comprising the steps of forming a metallic nanoparticle pattern on a substrate using a mold made from PDMS (poly(dimethylsiloxane) polymer as a stamp, and heat-treating the substrate.

2. Description of the Related Art

A variety of methods for forming conductive metal patterns are currently used in various industrial fields. For example, the conductive metal patterns are formed by photolithography methods using a photoresist, silk screen methods using a metal paste, etc. However, according to the recent industrial and technological development, there is a need for methods capable of forming conductive metal patterns in a simple, convenient and cost-effective manner. From these views, special attention has been paid to a micro-contact painting technique.

The micro-contact printing technique is a process for forming a pattern by stamping the pattern on a substrate. Herein, a mold made from PDMS polymer is used as a stamp and an organic molecule or an organic metal compound/colloidal metallic nanoparticles is used as ink. According to the micro-contact printing technique, the pattern in size of 0.1–100 microns can be easily formed (see, Angew. Chem. Int. Ed., 1998, vol. 37, p. 550).

The PDMS stamp is advantageous in that it has low surface energy, high chemical stability, and excellent formability into various shapes. Accordingly, various methods using the PDMS stamp have been developed.

For example, U.S. Pat. No. 6,048,623 is disclosing a method for forming a metal pattern comprising forming self assembly monolayer by transferring organic molecular with a functional group capable of binding with a metal surface, onto the substrate and etching unpatterned area chemically. At this time, the organic self assembly monolayer acts as a resist during chemical etching.

U.S. Pat. Nos. 3,873,359, 3,873,360 and 3,900,614 disclose a method for forming a metal pattern on a substrate comprising forming a pattern of organic metal compound/colloid metallic nanoparticles having catalytic activity in a micro-contact printing method, and treating the pattern through an electroless plating process to form a resultant metal pattern by catalysis of the organic metal compound. In this method, micropatterns is formed in a simple and cost-effective manner, without the use of complicated lithography systems.

Unlike above-mentioned methods, Chemistry of Materials (2001, vol. 13, p. 87) discloses a different method for forming a metal thin film using metallic nanoparticles, wherein a plurality of gold nanoparticle self assembly monolayers are stacked on a substrate, followed by heat-treating the monolayers at a temperature of 250–350° C. In addition, similar methods are disclosed in Korean Patent Laid-Open Publication No. 1998-025037, etc.

However, conventional micro-contact printing techniques using a metallic nanoparticle colloid as ink is disadvantageous in that the use of only the metallic nanoparticle colloid makes it difficult to form a high quality thick pattern because metallic nanoparticles are widely dispersed in the colloid. In addition, it is difficult to obtain high conductivity in the case of conductive metal pattern.

SUMMARY OF THE INVENTION

Therefore, the present invention has been made in view of the above problems, and it is an object of the present invention to provide a method for forming a high quality metal pattern by shortening the distance between metallic nanoparticles in a metallic nanoparticle colloid and simply heat-treating the metallic nanoparticle colloid.

In order to solve the object of the present invention, a bifunctional compound is added to a metallic nanoparticle colloid to shorten the distance between metallic nanoparticles in the ink, thereby increasing the concentration of the metallic nanoparticles in a metal pattern formed using the metallic nanoparticle colloid.

In accordance with one aspect of the present invention, there is provided a metallic nanoparticle cluster ink prepared by adding a bifunctional compound represented by the following formula (1) to a metallic nanoparticle colloid:

$$X\text{—}R\text{—}Y \qquad (1)$$

wherein R is a linear or branched hydrocarbon chain having 2~22 carbon atoms; and X and Y are independently isocyano, sulfonyl, phosphate, carboxyl, amino or thiol group.

In accordance with another aspect of the present invention, there is provided a method for forming a conductive metal pattern comprising the steps of:

(i) transferring the metallic nanoparticle cluster ink onto a substrate using a PDMS stamp in a micro-contact printing technique to form a metallic nanoparticle cluster pattern; and (ii) heat-treating the formed metallic nanoparticle cluster pattern in the vicinity of the melting point of metallic nanoparticles to form the conductive metal pattern.

BRIEF DESCRIPTION OF THE DRAWINGS

The above and other objects, features and other advantages of the present invention will be more clearly understood from the following detailed description taken in conjunction with the accompanying drawings in which.

DESCRIPTION OF THE PREFERRED EMBODIMENTS

Hereinafter, the present invention will be described in more detail.

A metallic nanoparticle cluster ink used in the present invention is prepared by adding a bifunctional compound to a metallic nanoparticle colloid.

Examples of nanoparticles usable in the preparation of the ink include nanoparticles of a metal selected from the group consisting of transition metals, lanthanides, actinoides, and alloys thereof (e.g., silver/palladium, silver/platinum, etc). Colloids containing these nanoparticles Can be easily produced in accordance with conventional wet chemical processes (Langmuir, 1998, vol. 14, p. 226).

In the present invention, the bifunctional compound added to the metallic nanoparticle colloid in order to shorten the distance between metallic nanoparticles has a structure represented by the following formula (1):

$$X—R—Y \qquad (1)$$

wherein R is a linear or branched hydrocarbon chain having 2~22 carbon atoms; and X and Y are independently isocyano, sulfonyl, phosphate, carboxyl, amino or thiol group.

Preferred examples of the bifunctional compound include, not limited to, alkyldiamine such as methanediamine, ethylenediamine, propylenediamine, etc.; alkyldiisocyanide such as methanediisocyanide, ethylenediisocyanide, propylenediisocyanide, etc.; and alkanedithiol such as methanedithiol, ethanedithiol, hexanedithiol, etc. As described above, the bifunctional compound acts on nanoparticles to shorten their distances between them when added to the metallic nanoparticle colloid. Thereby, a high quality of thick metal pattern is formed after heat-treatment.

In the present invention, the term "metallic nanoparticle cluster ink" refers to a dispersed liquid prepared by adding the bifunctional compound into the metallic nanoparticle colloid. The amount of the bifunctional compound added to the metallic nanoparticle cluster ink requires considerable care because the metallic nanoparticles are completely coagulated with each other to precipitate with addition of excess of the bifunctional compound. The bifunctional compound is preferably added within the range of 0.1–1.6 mol, relative to one mol of the metallic nanoparticles.

In the present invention, micrometer-sized pattern is formed by adding adequate amount of the metallic nanoparticle cluster ink into a substrate and contacting a PDMS stamp on the surface of the substrate to form a pattern.

Figure 1:
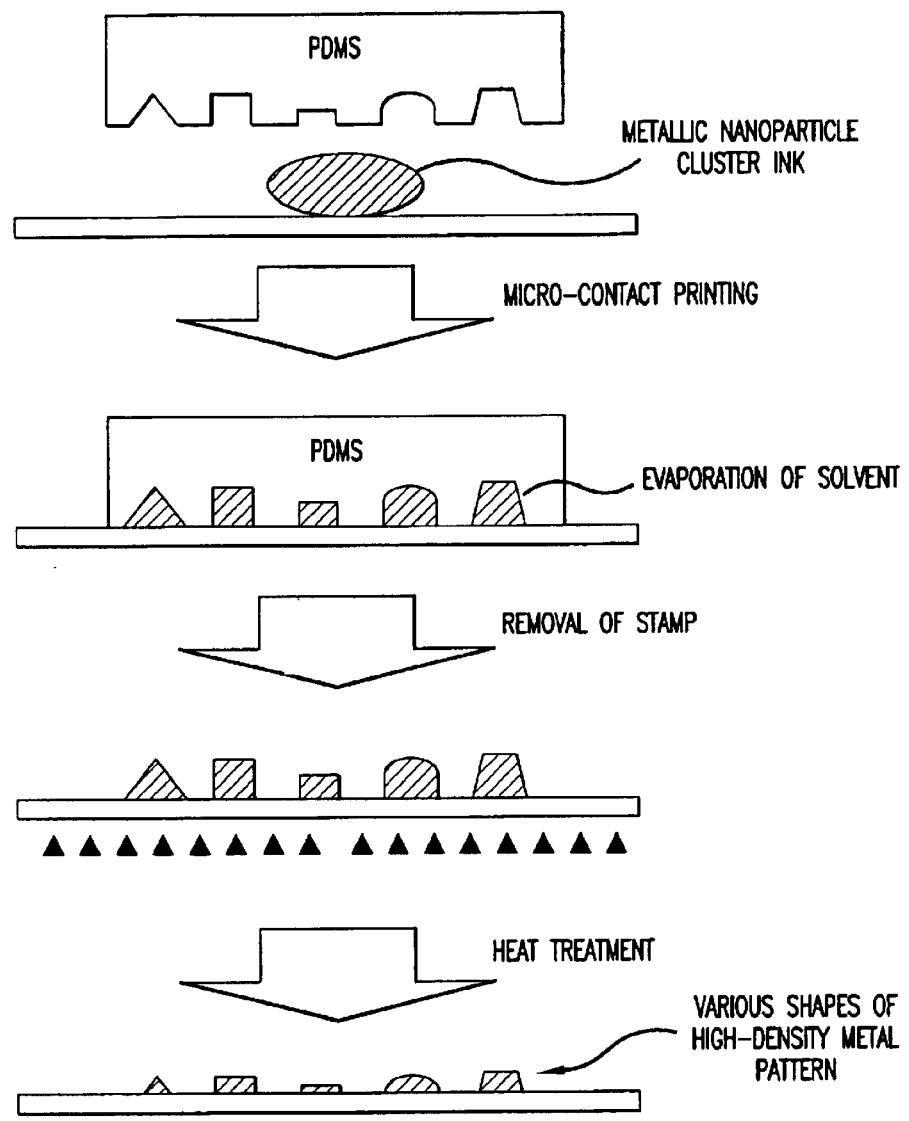
FIG. 1 illustrates a flowchart schematically showing a method for forming a metal pattern according to the present invention.

FIG. 1 illustrates a flowchart schematically showing a method for forming a metal pattern according to the present invention. The substrate made of glass or silicone is cleaned using acetone, ethanol and distilled water to remove organic materials or other contaminants on the surface of the substrate and to efficiently improve a combination of the cluster ink and the substrate. Subsequently, an appropriate amount of the metallic nanoparticle cluster ink is added on the surface of the substrate. Then, a PDMS stamp is placed on the ink and pressed using adequate power for a determined time with maintaining a contact with the substrate. An excess amount of the ink is discharged to the outside of the stamp and can be removed by casting method.

Figure 2:
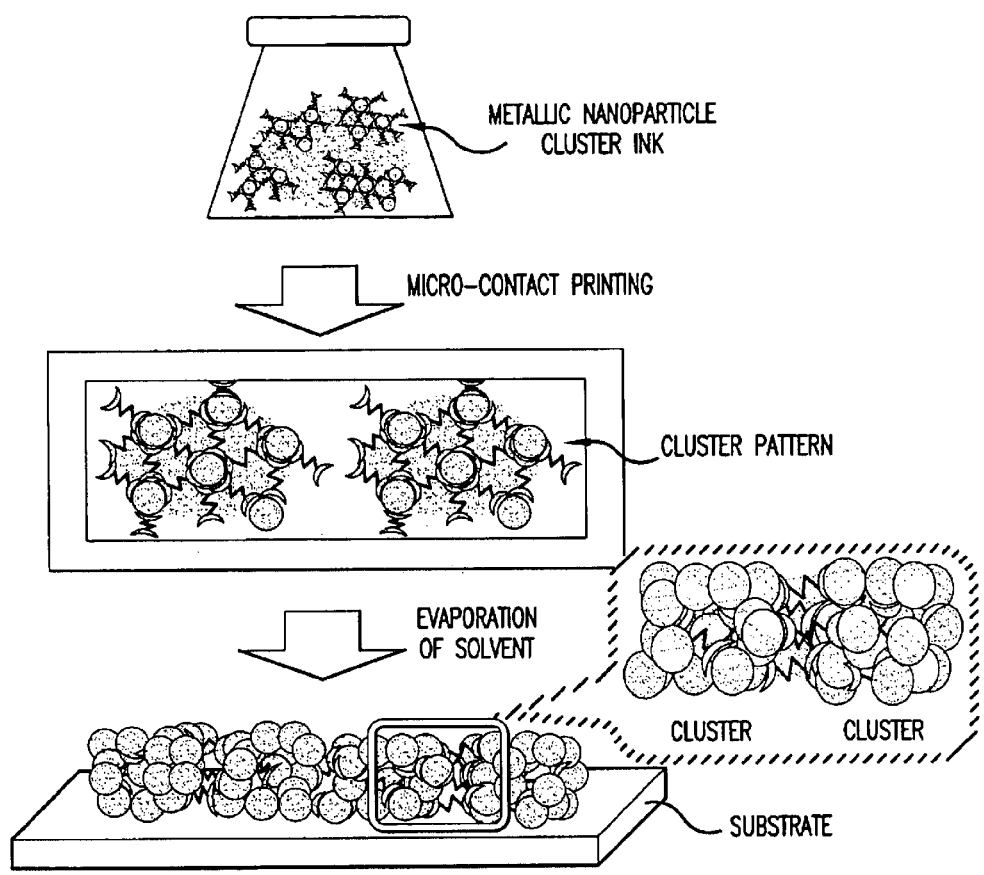
FIG. 2 illustrates a self-assembled state of metallic nanoparticle clusters.

During the contact of the substrate and the stamp, dispersion solvent of the metallic nanoparticle cluster ink is evaporated and self-assembled cluster pattern is formed by secondary combining of the nanoparticle cluster using the remaining linkers which exist on the surface of the cluster. (See, FIG. 2)

At this time, diverse patterns having a different shape and thickness can be easily and economically formed by changing the shape and the size of PDMS stamp.

Finally, when the pattern is heat-treated in the vicinity of the melting point of the metallic nanoparticles, metallic nanoparticles are melted and metallized. Through these processes, thick metal pattern having metallic surface is produced. The temperature and time for heat-treatment are suitably determined depending on the kind of metallic nanoparticle, its size, and the thickness of the metal pattern formed on the substrate.

The present invention will now be illustrated in more detail with reference to Examples. These Examples are provided only for illustrative purposes, but are not to be construed as limiting the scope of the present invention.

PREPARATIVE EXAMPLE

Figure 3:
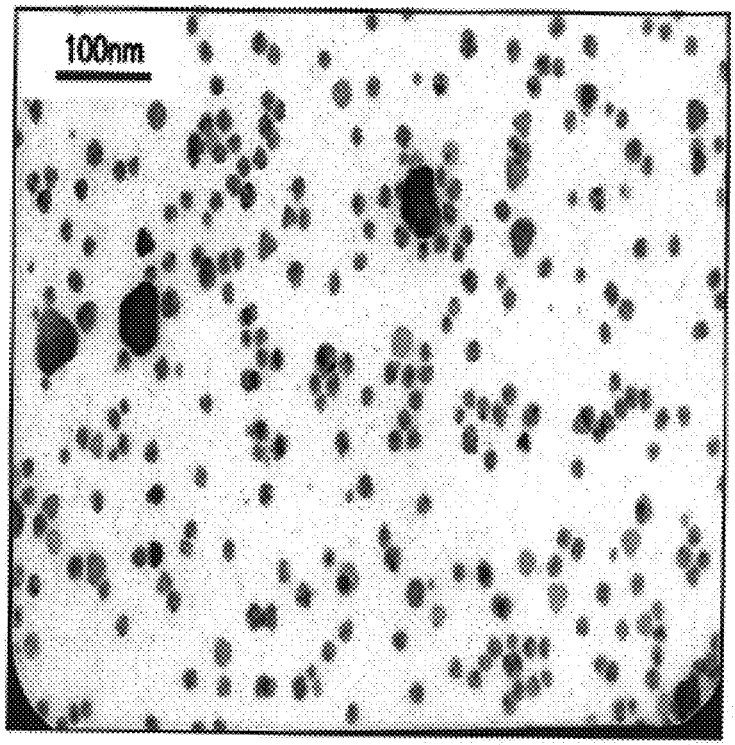
FIG. 3 illustrates a transmission electron microscopic image of silver•palladium alloy nanoparticles prepared in a Preparative Example.

Preparation of Silver•Palladium Alloy Nanoparticle Cluster Ink Containing the Alloy Nanoparticles 0.9 mmol (0.168 g ) of silver nitrate and 0.1 mmol (0.023 g) of palladium nitrate were dissolved in 30 ml of ethanol. 0.1 ml of dodecanthiol was added to the solution as a stabilizer and then 0.15 g of sodium borohydride in 60 ml of ethanol was added thereto as a reducing agent. The resulting mixture was reacted for 3 hours to precipitate silver•palladium alloy nanoparticles. The precipitated nanoparticles were collected, washed with ethanol several times to remove excess stabilizer, and dispersed in toluene to obtain a brownish colloid. The silver•palladium alloy nanoparticles had a spherical shape having a diameter of 20 nm. The transmission electron microscopy (EM912 Omega) revealed that the ratio of silver to palladium in the alloy nanoparticles was 9:1 (see, FIG. 3). Using the metallic nanoparticle colloid, 5 kind of silver•palladium alloy nanoparticle cluster ink were prepared by respectively adding 0.001 µl, 0.005 µl, 0.01 µl, 0.05 µl and 0.1 µl of ethanedithiol into the colloid metallic nanoparticle ink (0.63M). The adding amounts respectively correspond to 0.0155 mol, 0.031 mol, 0.155 mol, 0.31 mol and 1.55 mol per 1 mol of metallic nanoparticle.

EXAMPLE 1

Formation of Silver•Palladium Alloy Nanoparticle Pattern

A silver•palladium alloy nanoparticle pattern was formed using the silver•palladium alloy nanoparticle cluster ink (wherein ethanedithiol 0.1 µl had been added) prepared in Preparative Example in accordance with a micro-contact printing method. At this time, a PDMS stamp was manufactured using known processes (see, Langmuir, 1994, vol. 10, p. 1498): first, part A and part B of Sylgard™ 184 silicone elastomer (Dow Corning Corporation, U.S.A) were mixed in a weight ratio of 10:1 in a plastic beaker. The mixture was poured on a patterned master having a desired shape by a lithography method, let stand at room temperature for 2 hours, and then cured in an oven at 60° C. for 2 hours to obtain a stamp. Pattern of the obtained stamp had a line width of 50 µm, a depth of 50 µm, and a line spacing of 100 µm.

Figure 4:
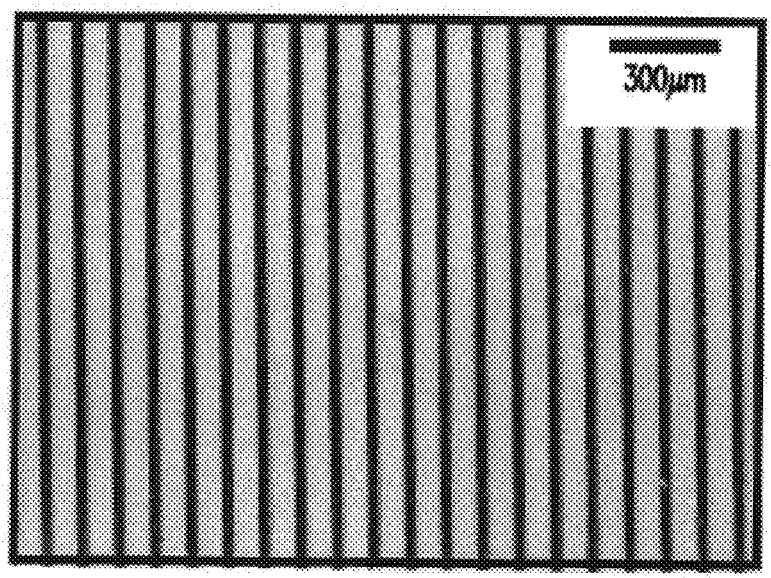
FIG. 4 illustrates a microscopic image showing a conductive silver•palladium alloy pattern prepared in an Example 1 of the present invention.

Then, the silver•palladium alloy nanoparticle cluster ink obtained from the Preparative Example was added on the surface of glass substrate on which contaminants had been completely removed. The PDMS stamp was carefully placed on the ink and contacted with the substrate by being pressed with adequate power. An excess amount of the ink which was discharged to the outside of the stamp was removed by casting method. After evaporation of a solvent of the ink, the stamp was removed to obtain a determined shape of silver•palladium alloy nanoparticle cluster pattern. Then, heat-treatment was prosecuted for transferring the silver•palladium alloy nanoparticle cluster pattern to a perfect metal pattern. The substrate was placed on a hot plate at the temperature of 320° C. for 30 min to form high density silver•palladium alloy pattern. During the heat-treatment, inert gas atmosphere was maintained for preventing oxidation of silver•palladium alloy pattern. FIG. 4 is a microscopic image of the conductive silver•palladium alloy pattern produced in the above. The obtained pattern had a line width of 50 μm, a height of 1 μm, and a line spacing of 100 μm.

EXAMPLE 2

Figure 5:
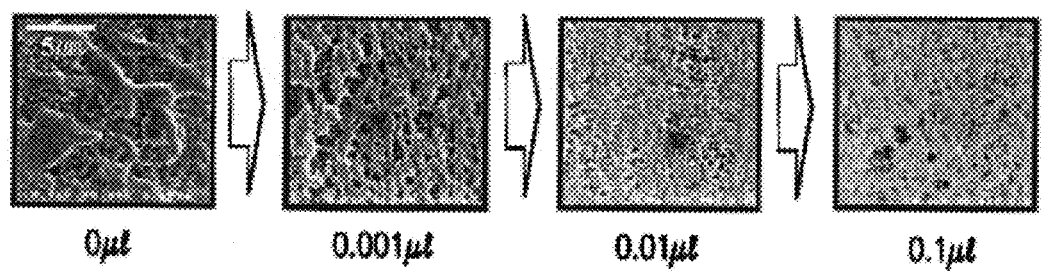
FIG. 5 illustrates a transmission electron microscopic image showing a density variation according to the adding amount of bifunctional compound.

Properties of Metal Pattern According to the Adding Amount of the Bifunctional Compound Silver•palladium alloy patterns were formed using the 5 kind of cluster inks obtained from Preparative Example, according to the same method as Example 1. FIG. 5 shows transmission electron microscopic images of the resultant patterns. It is confirmed from FIG. 5 that addition of adequate amount of bifunctional compound makes particles in pattern dense and uniform to form high-density metal pattern.

Figure 6:
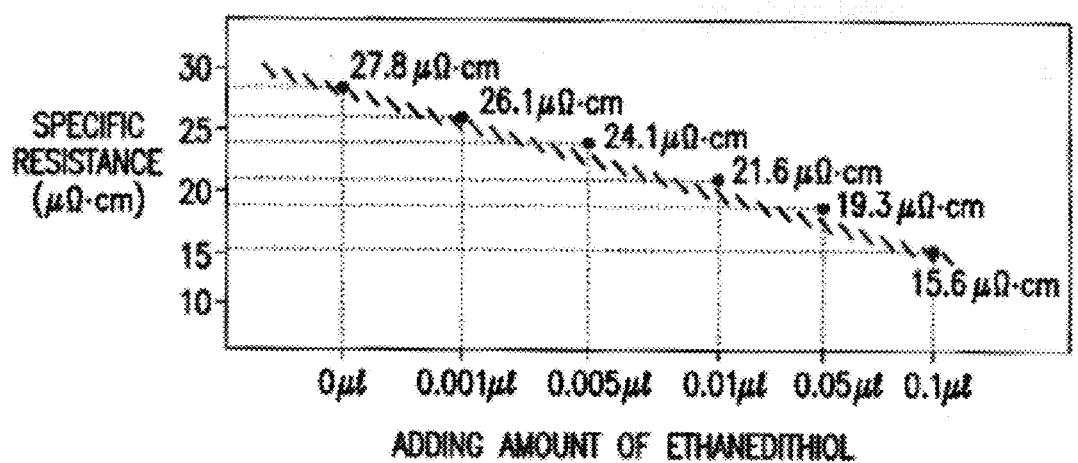
FIG. 6 illustrates a graph showing a conductivity variation according to the adding amount of bifunctional compound.

In addition, electronic conductivity of the resultant patterns was measured to observe a variation of conductivity of the metal patterns according to the adding amount of bifunctional compound. FIG. 6 illustrates a graph showing a conductivity variation according to the adding amount of bifunctional compound. Electric conductivity was measured for a linear metal pattern. Thus, electronic conductivity was measured after others except one linear metal pattern were transferred to nonconductive material. When bifunctional compound was not added, specific resistance was not lowered below 27 μΩcm. However, once bifunctional compound was added, electric conductivity of silver•palladium alloy pattern was increased by degrees. When 0.1 μl of ethanedithiol was added, specific resistance of silver•palladium alloy pattern was lowered to 15.6 μΩcm.

As described above, according to the present invention, the micrometer-sized conductive metal patterns can be easily formed on various substrates in a simple and inexpensive manner without the use of costly systems. Accordingly, the present invention is expected to be useful in various industrial fields.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a conductive metal pattern comprising the steps of:

(i) transferring a metallic nanoparticle cluster ink prepared by adding a bifunctional compound represented by the following formula (1) to a metallic nanoparticle colloid:

$$X-R-Y \qquad (1)$$

wherein R is a linear or branched hydrocarbon chain having 2~22 carbon atoms; and X and Y are independently an isocyano, a sulfonyl, a phosphate, a carboxyl, an amino or a thiol group onto a substrate using a PDMS stamp in a micro-contact printing technique to form a metallic nanoparticle cluster pattern; and (ii) heat-treating the formed metallic nanoparticle cluster pattern in the vicinity of the melting point of metallic nanoparticles to form the conductive metal pattern.

2. The method for forming a conductive metal pattern as set forth in claim 1, wherein a dispersion solvent of the ink is evaporated during the contact of the stamp and the substrate to form a self-assembled metallic nanoparticle cluster pattern.

* * * * *